United States Patent
Ahmed et al.

(10) Patent No.: US 12,246,615 B2
(45) Date of Patent: Mar. 11, 2025

(54) CURRENT SENSORS FOR BATTERY CELLS OF A VEHICLE BATTERY SYSTEM

(71) Applicant: GM GLOBAL TECHNOLOGY OPERATIONS LLC, Detroit, MI (US)

(72) Inventors: Mohamed Ahmed Kamel Ahmed, Birmingham, MI (US); Chandra S. Namuduri, Troy, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 174 days.

(21) Appl. No.: 18/097,375

(22) Filed: Jan. 16, 2023

(65) Prior Publication Data

US 2024/0239235 A1    Jul. 18, 2024

(51) Int. Cl.
*B60L 58/12* (2019.01)
*G01R 31/3828* (2019.01)
*H02M 1/00* (2007.01)

(52) U.S. Cl.
CPC .......... *B60L 58/12* (2019.02); *G01R 31/3828* (2019.01); *H02M 1/0009* (2021.05); *B60L 2210/10* (2013.01); *B60L 2240/54* (2013.01); *H02J 2310/48* (2020.01)

(58) Field of Classification Search
CPC .. B60L 58/12; B60L 2210/10; B60L 2240/54; G01R 31/3828; H02M 1/0009; H02J 2310/48
USPC ....................................................... 307/10.1
See application file for complete search history.

(56) References Cited

U.S. PATENT DOCUMENTS

| | | | | |
|---|---|---|---|---|
| 2009/0243518 | A1* | 10/2009 | Itoh ........................ | B60L 58/15 |
| | | | | 903/930 |
| 2019/0361075 | A1* | 11/2019 | Lee ..................... | H01M 10/4207 |
| 2020/0176830 | A1* | 6/2020 | Huff ..................... | H01M 50/209 |
| 2024/0178534 | A1* | 5/2024 | George ............... | H01M 50/581 |
| 2024/0190276 | A1* | 6/2024 | Absar ..................... | B60L 50/60 |

OTHER PUBLICATIONS

U.S. Appl. No. 17/839,769, filed Jun. 14, 2022, Kamel et al.

\* cited by examiner

*Primary Examiner* — Hal Kaplan
*Assistant Examiner* — Swarna N Chowdhuri

(57) ABSTRACT

A battery system for an electric vehicle includes at least one battery cell configured to store charge for powering an electric vehicle, a high voltage bus electrically coupled with the at least one battery, a DC-DC converter electrically coupled with the battery cell, a low voltage bus electrically connected between the DC-DC converter and at least one vehicle electrical component, and a cell monitor electrically coupled with the at least one battery cell and the DC-DC converter, wherein the cell monitor includes a current sensor configured to detect a current from the at least one battery cell to the DC-DC converter. The cell monitor includes a controller configured to estimate a state of charge of the at least one battery cell according to the current detected by the current sensor, and adjust switching operation of the DC-DC converter according to the current detected by the current sensor.

20 Claims, 5 Drawing Sheets

CURRENT SENSORS FOR BATTERY CELLS OF A VEHICLE BATTERY SYSTEM

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure generally relates to current sensors for battery cells of a vehicle battery system, and more particularly, to current sensors for detecting current from an individual battery cell to a DC-DC converter for a low voltage bus.

SUMMARY

A battery system for an electric vehicle includes at least one battery cell configured to store charge for powering an electric vehicle, a high voltage bus electrically coupled with the at least one battery cell to provide power to an electric motor of the electric vehicle, a DC-DC converter electrically coupled with the battery cell, a low voltage bus electrically connected between the DC-DC converter and at least one vehicle electrical component, the low voltage bus configured to provide low voltage power to the at least one vehicle electrical component, and a cell monitor electrically coupled with the at least one battery cell and the DC-DC converter, wherein the cell monitor includes a current sensor configured to detect a current from the at least one battery cell to the DC-DC converter. The cell monitor includes a controller configured to estimate a state of charge of the at least one battery cell according to the current detected by the current sensor, and adjust switching operation of the DC-DC converter according to the current detected by the current sensor.

In other features, the system includes multiple battery cells including the at least one battery cell, the multiple battery cells electrically coupled in series with the high voltage bus, multiple DC-DC converters including the DC-DC converter, each of the multiple DC-DC converters electrically coupled between the low voltage bus and a corresponding one of the multiple battery cells, and multiple cell monitors including the cell monitor, each of the cell monitors electrically coupled with a corresponding one of the multiple battery cells and a corresponding one of the multiple DC-DC converters, wherein each cell monitor includes a current sensor configured to detect a current from the corresponding one of the multiple battery cells to the corresponding one of the multiple DC-DC converters.

In other features, the cell monitor includes a battery cell interface configured to obtain a sensed voltage of the at least one battery cell and a sensed temperature of the at least one battery cell, and the controller is configured to estimate the state of charge of the at least one battery cell according to the sensed voltage of the at least one battery cell and the sensed temperature of the at least one battery cell.

In other features, the DC-DC converter is integrated on a same circuit board with the cell monitor.

In other features, the controller is configured to transmit the estimated state of charge of the at least one battery cell to a central system controller.

In other features, the cell monitor includes a transmitter electrically coupled with an antenna, and the controller is configured to transmit the estimated state of charge to the central system controller wirelessly via the transmitter and the antenna.

In other features, a wire is electrically connected between the cell monitor and the central system controller; and the controller is configured to transmit the estimated state of charge to the central system controller via the wire.

In other features, the DC-DC converter is configured to output power to the low voltage bus at a voltage of less than or equal to 48 volts.

In other features, the system includes a battery current sensor coupled in series with the at least one battery cell, wherein the battery current sensor is configured to detect a current through the at least one battery cell along the high voltage bus.

In other features, the controller is configured to determine a total current according to a combination of the current through the at least one battery cell along the high voltage bus as detected by the battery current sensor, and the current detected from the at least one battery cell to the DC-DC converter, and estimate the state of charge of the at least one battery cell according to the total current.

In other features, the current sensor configured to detect the current from the at least one battery cell to the DC-DC converter has a current rating in a range from about 10 amps to about 30 amps, and the battery current sensor has a current rating in a range from about 100 amps to about 1000 amps.

In other features, the controller is configured to estimate an input current of the DC-DC converter according to a combination of the total current, a temperature of the at least one battery cell, a trim voltage setting, and at least one of an input voltage of the DC-DC converter or an output voltage of the DC-DC converter.

In other features, the current sensor includes at least one of a hall effect current sensor, a giant magneto resistive (GMR) current sensor, and a tunneling magneto resistive (TMR) current sensor.

In other features, the current sensor comprises a fusible link current sensor electrically coupled with the DC-DC converter.

In other features, the cell monitor includes a fuse coupled with the DC-DC converter.

In other features, the fuse comprises a programmable and resettable electronic fuse.

A battery system for an electric vehicle includes at least one battery cell configured to store charge for powering an electric vehicle, a high voltage bus electrically coupled with the at least one battery cell to provide power to an electric motor of the electric vehicle, a DC-DC converter electrically coupled with the battery cell, a low voltage bus electrically connected between the DC-DC converter and at least one vehicle electrical component, the low voltage bus configured to provide low voltage power to the at least one vehicle electrical component, and a cell monitor electrically coupled with the at least one battery cell and the DC-DC converter, wherein the cell monitor includes a current sensor configured to detect a current from the at least one battery cell to the DC-DC converter, a transmitter, an antenna, and a controller configured to estimate a state of charge of the at least one battery cell according to the current detected by the current sensor, and transmit the estimated state of charge to a central system controller wirelessly via the transmitter and the antenna.

In other features, the system includes multiple battery cells including the at least one battery cell, the multiple battery cells electrically coupled in series with the high voltage bus, multiple DC-DC converters including the DC- DC converter, each of the multiple DC-DC converters electrically coupled between the low voltage bus and a corresponding one of the multiple battery cells, and multiple cell monitors including the cell monitor, each of the cell monitors electrically coupled with a corresponding one of the multiple battery cells and a corresponding one of the multiple DC-DC converters, wherein each cell monitor includes a current sensor configured to detect a current from the corresponding one of the multiple battery cells to the corresponding one of the multiple DC-DC converters.

A battery system for an electric vehicle includes at least one battery cell configured to store charge for powering an electric vehicle, a high voltage bus electrically coupled with the at least one battery cell to provide power to an electric motor of the electric vehicle, a DC-DC converter electrically coupled with the battery cell, a low voltage bus electrically connected between the DC-DC converter and at least one vehicle electrical component, the low voltage bus configured to provide low voltage power to the at least one vehicle electrical component, a battery current sensor coupled in series with the at least one battery cell, the battery current sensor is configured to detect a current through the at least one battery cell along the high voltage bus, and a cell monitor electrically coupled with the at least one battery cell and the DC-DC converter, wherein the cell monitor includes a converter current sensor configured to detect a current from the at least one battery cell to the DC-DC converter, wherein the cell monitor includes a controller configured to determine a total current according to a combination of the current through the at least one battery cell along the high voltage bus as detected by the battery current sensor, and the current detected from the at least one battery cell to the DC-DC converter, estimate a state of charge of the at least one battery cell according to the total current, and adjust switching operation of the DC-DC converter according to the total current.

In other features, the controller is configured to transmit the estimated state of charge of the at least one battery cell to a central system controller.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
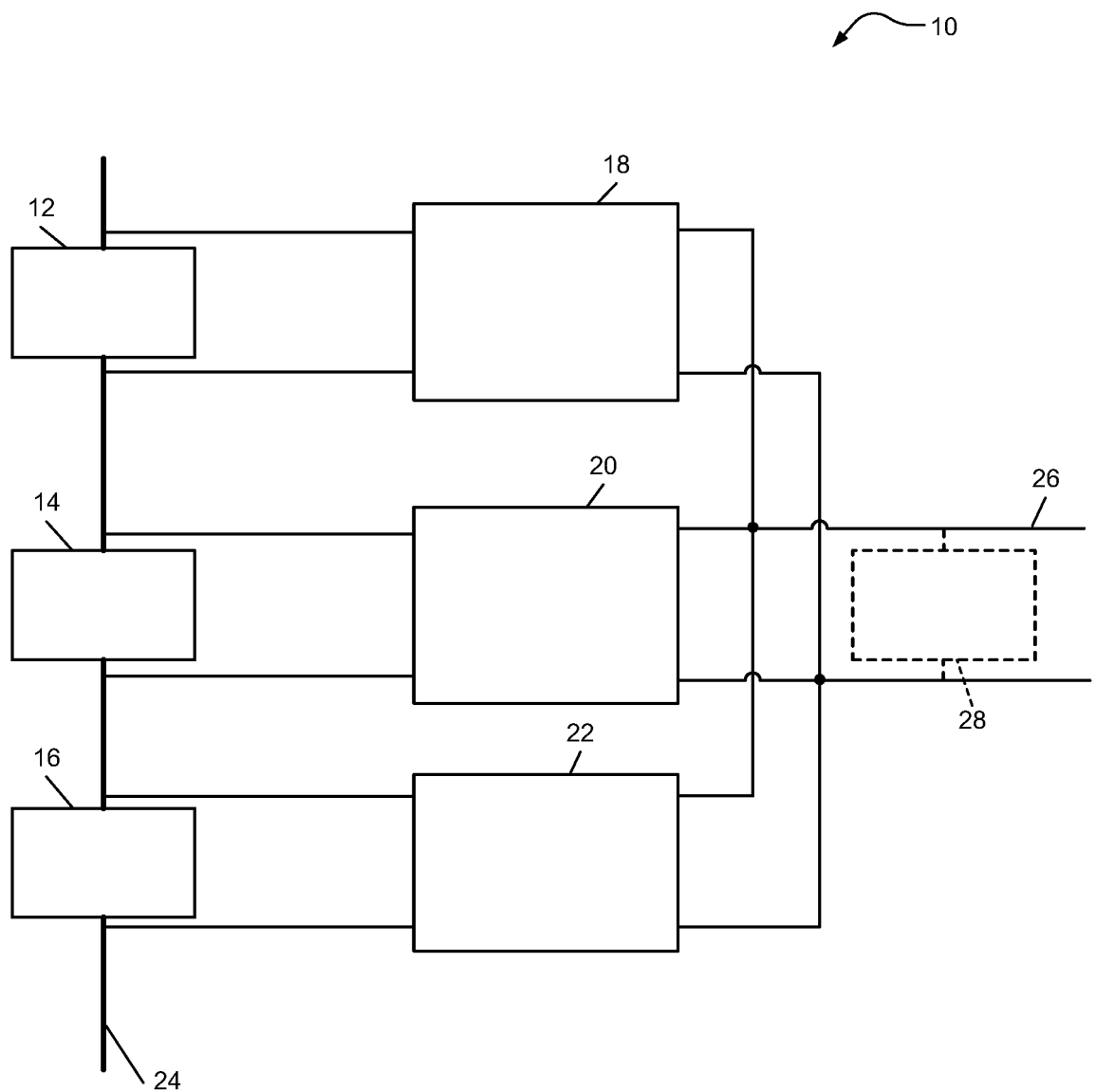
FIG. 1 is a block diagram illustrating an example vehicle battery system including multiple battery cell modules and multiple DC-DC power converters.

While battery cell systems with DC-DC converters are described herein in the context of EVs, the battery cell systems can be used in stationary applications and/or in other applications.

In some example embodiments described herein, a battery cell module includes an integrated cell monitor, which may communicate a current supplied from the battery cell module to an auxiliary converter circuit, a net current through the battery cell module, etc., to a central battery management controller (e.g., a system controller). For example, a battery management system may rely on measured voltage of individual battery cells, measured temperatures of the battery cells, current flowing through each individual battery cell, etc., in order to estimate a state of charge of each individual battery cell.

In some examples, a single current sensor may be used to measure the current through all battery cell modules connected in series in the system. This may not be suitable for a system having distributed power converters across individual battery cell modules, for redundant low voltage load support.

In various implementations, a battery cell module may be electrically coupled with a cell monitor configured to individually measure a current, a voltage, a temperature, etc., of the battery cell module. The cell monitor may be configured to communicate with a central controller in a wired or wireless manner, to provide, e.g., simultaneously sampled values of current, voltage, temperature, etc. of the battery cell module. The values of current, voltage, temperature, etc. may be averaged over a given time period, prior to transmitting the values to the central system controller.

In some examples, the cell monitor includes power terminals configured to connect with a DC-DC converter that is internal to the cell monitor, a DC-DC converter that is external to the cell monitor, etc. The DC-DC converter may be configured to output low voltage power to a low voltage bus, such as power have a voltage of about 3.3 V, about 5 V, about 12 V, about 24 V, about 48 V, etc.

The use of a current sensor in each individual cell monitor may allow for more precise monitoring of each individual battery cell and DC-DC converter. For example, a cell monitor may include a current sensor (e.g., a converter current sensor) in series with a DC-DC converter, to measure input current drawn by the DC-DC converter. In various implementations, the current sensor may sense current along a wire or bus connected between the battery cell and the DC-DC converter.

In some example embodiments, another current sensor (e.g., a battery cell current sensor) may be configured to measure a current through a battery cell, e.g., along the high voltage bus (which may be referred to as a high voltage bus current). A controller of the cell monitor may be configured to determine a net current though the module, such as by adding a sum of the measure high voltage bus current and the DC-DC converter input current.

The current sensor(s) may include any suitable type of current sensor devices. For example, the current sensor may be a copper conductor resistance type current sensor, a hall effect current sensor, a giant magneto resistive current sensor, a tunneling magneto resistive current sensor, a current shunt, a coreless current sensor, a point-field detector, any other suitable current sensor device that may sense current that can be read by a controller, etc.

In some example embodiments, a vehicle battery system may include multiple distributed DC-DC converters, to provide redundant power for low voltage loads with reduced costs. In a distributed DC-DC converter arrangement, it is desirable to have sensed operating parameters (such as voltage, current, temperature, etc.) at the individual battery cell and DC-DC power converter level). For example, obtaining operating parameters for individual battery cells and/or DC-DC power converters may allow for balancing currents, distributing power to different modules, providing more precise control of the modules, etc.

Sending current of individual battery cells and/or DC-DC converters may be accomplished by a cell monitor having an integrated current sensor. The cell monitor may be configured to perform simultaneous or near simultaneous sampling of a voltage of the battery cell, a current of the battery cell, a temperature of the battery cell, etc.

The cell monitor may include power terminals for interfacing with the DC-DC converter to generate isolated low voltage power. For example, the cell monitor may receive a voltage from the battery cell, and provide the voltage to the DC-DC converter through the power terminals, to supply input power to the DC-DC converter from the battery cell.

In other embodiments, the DC-DC converter may be integrated with the cell monitor. For example, the DC-DC power converter may be in a same housing as the cell monitor, may be on a same circuit board as the cell monitor, may be in a same circuit package as the cell monitor, etc.

The cell monitor may include one or more fuses for protecting the DC-DC converter, the battery cell, the cell monitor, etc., from potential overcurrent conditions, etc. For example, a DC-DC converter interface of the cell monitor may include a passive fuse, a programmable/resettable electronic fuse, etc. In some examples, a fusible link current sensor may be used as a combined sensor and fuse (which may be non-serviceable).

In various implementations, the current sensor may be powered by, e.g., a bias power source of the battery cell, of the cell monitor, etc. The current sensor(s) may have any suitable current ratings. For example, a converter current sensor configured to measure a current of the DC-DC converter may have a current rating in a range of about 10 A to about 30 A.

Each current sensor may have unidirectional current sensing capabilities, or may have bidirectional current sensing capabilities. A battery cell current sensor may have a current rating in a range of about 100 A to about 1000 A. The battery cell current sensor may have an accuracy of, e.g., about one percent.

As mentioned above, a cell monitor with an integrated current sensor facilitates accurate estimation of state of charge for individual battery cells. The cell monitor may be configured to transmit sensed operating parameters, an estimated state of charge (SOC) of the battery cell, etc., to a central system controller.

For example, the cell monitor may include a transmitter and antenna for wireless communication with the central system controller, a wired connection to the central system controller, etc. The cell monitor may be configured to provide the central system controller with, for example, sampled values (e.g., simultaneously sampled values) of battery cell current, battery cell voltage, battery cell temperature, etc., which may be averaged over a specified time period.

In various implementations, the cell monitor may include a signal condition module to perform signal conditioning on, e.g., parameters of the battery cell and/or DC-DC converter as sensed by the cell monitor. The sensed parameters may be converted to a suitable format for use within the cell monitor (e.g., to adjust switching operation of the DC-DC converter, to facilitate charging of the battery cell, etc. The sensed parameters may be broadcast to a system controller for estimation of a battery cell state of charge, state of health, state of function, etc.

In some example embodiments, a controller of the cell monitor may be configured to estimate an input current of the DC-DC power converter based on, e.g., an output voltage of the DC-DC power converter, a total load current of the battery cell, a trim voltage or trim setting, a temperature of the battery cell and/or DC-DC converter, etc.

The controller may be configured to estimate an input current of the DC-DC power converter based on, e.g., an input voltage of the DC-DC power converter, a total load current of the battery cell, a trim voltage or trim setting, a temperature of the battery cell and/or DC-DC converter, etc. In various implementations, the estimated input and/or output current of the DC-DC converter may be determined based on a look up table.

In some examples, a group of battery cells may be connected in series, such as 8 to 12 battery cells, etc. If a single current sensor is used to measure current through all battery cells in series, cell monitors may balance voltages of the, e.g., 8 battery cells, based on only voltage and temperature readings at each battery cell (e.g., because the cell monitors do not have individual current sensing for each battery cell).

For example, some vehicle battery systems may include a current shunt that measures a total current of all battery cells in series, and opens or closes relays to high voltage terminals for the series-connected batteries. A vehicle integration control module (VICM) may be configured to estimate a state of charge of a whole battery pack (e.g., multiple battery cells connected in series), based on the total current and voltage of the series-connected battery cells. The vehicle integration control module may then use the estimated state of charge value to apply appropriate controls to, for example, a traction system of the electric vehicle.

Using multiple DC-DC converters, where one or more DC-DC converters is electrically connected with a corresponding battery cell, may provide benefits of redundancy over arrangements that use a single DC-DC converter in the system for powering a low voltage bus.

For example, with a single DC-DC converter in the system, any failure of the DC-DC converter would cause a power loss on the low voltage bus. In contrast, using multiple DC-DC converters allows for maintaining power on the low voltage bus even if one or more of the DC-DC converters fails.

Due to the smaller size of the DC-DC converters, the converters may be integrated with cell monitors at each battery cell, the converters may be integrated with cell monitors at groups of battery cells, may be housed together in a central location such as a converter housing enclosure, etc. The outputs of the DC-DC converters may be coupled with the low voltage bus in parallel, or in series.

Using multiple DC-DC converters may provide improvements in efficiency, compared to a single DC-DC converter for the whole battery system. For example, if a single DC-DC converter is used at, e.g., 2 KW, another 2 kW DC-DC converter may be required for backup in case the first one fails.

If ten smaller DC-DC converters are used, they may each be rated at, for example, 220 W per DC-DC converter. If one of the DC-DC converters fails, the other may only have to increase their power by about 10% in order to maintain power supplied to the low voltage bus. In addition, it may be more efficient to convert a lower input voltage at each individual DC-DC converter. For example, the input voltage supplied to a DC-DC converter from an individual battery cell may be much lower than a high voltage of an entire battery cell stack supplied to a single DC-DC converter.

As mentioned above, with multiple DC-DC converters each coupled to one of the battery cells, the DC-DC converters will draw some current from the battery cells that is not part of the current flowing through all battery cells in series. In some example embodiments, a cell monitor at each battery cell includes one or more current sensors to measure current associated with the DC-DC converter.

For example, a DC-DC converter may be separate from a cell monitor, and the cell monitor may include a current sensor coupled in an electrical path between the battery cell and the DC-DC converter, to measure a current from the battery cell to the DC-DC converter.

In other example embodiments, the DC-DC converter may be integrated with the cell monitor, and the current sensor of the cell monitor may measure a current flowing through the cell monitor from the battery cell to the DC-DC converter. If the DC-DC converter is a part of the cell monitor, the cell monitor may be configured to measure an input and/or output current of the DC-DC converter, an input and/or output voltage of the DC-DC converter, etc.

In various implementations, the cell monitor may sample parameters of the battery cell and/or DC-DC converter (such as current, voltage, temperature, etc.), on a periodic basis. For example, the cell monitor may be configured to simultaneously sample multiple operating parameters ten times per second, 100 times per second, etc.

The cell monitor may be configured to transmit the sampled values to, e.g., a central system controller for managing operation of the battery cells, every tenth of a second, every hundredth of a second, etc. For example, the central system controller may use the received parameters to manage operation of the battery cells and/or DC-DC converters, changing operation settings of the battery cells and/or DC-DC converters, balance voltages and/or currents of the battery cells and/or DC-DC converters, estimate a state of charge (or state of health or state of function) for each battery cell, control charging and discharging of each battery cell, etc. The parameter sampling period may be the same or different compared to the parameter transmission period.

In various implementations, the cell monitor may be configured to perform signal conditioning on sampled parameter values, such as pulse-width modulation signal conditioning, etc. The cell monitor may be configured to estimate a state of charge, a state of health, a state of function, etc., of its individual corresponding battery cell.

Use of current sensors with cell monitors at each individual battery cell may improve state of charge estimation for each individual battery cell, may improve battery cell balancing for better overall battery capacity utilization, may increase performance of the electric vehicle, etc.

FIG. 1 is a block diagram illustrating an example of a vehicle battery system 10 including multiple battery cell modules and multiple DC-DC power converters. In particular, FIG. 1 illustrates a DC-DC power converter 18 electrically coupled with a battery cell module 12, a DC-DC power converter 20 electrically coupled with a battery cell module 14, and a DC-DC power converter 22 electrically coupled with a battery cell module 16.

The battery cell modules 12, 14 and 16 are coupled in series with a high voltage bus 24. The high voltage bus 24 may be configured to supply a high voltage to, e.g., an electric motor of an electric vehicle. Each battery cell module 12, 14 and 16 may include one or more battery cells. Although the vehicle battery system 10 of FIG. 1 is shown as including three battery cell modules 12, 14 and 16, and three DC-DC power converters 18, 20 and 22, it should be appreciated that other example embodiments may include more or less battery cell modules and/or DC-DC power converters.

Each DC-DC power converter 18, 20 and 22 is electrically coupled with a low voltage bus 26. The low voltage bus 26 may be configured to supply low voltage power to one or more low voltage electrical components of the vehicle. The low voltage bus 26 may optionally include a low voltage battery module 28.

Each of the DC-DC power converters 18, 20 and 22 may be an isolated power converter having opposing sides. One side (e.g., a high voltage side) of each DC-DC power converter 18, 20 and 22 is coupled to individual ones of the battery cell modules 12, 14 and 16. Each of the other sides (e.g., low voltage sides) of the DC-DC power converters 18, 20 and 22 are coupled in parallel and to the low voltage bus 26. In other example embodiments, the low voltage sides of the DC-DC power converters 18, 20 and 22 may be coupled with the low voltage bus 26 in another suitable configuration such as in a series configuration, a series-parallel configuration, etc.

Operation of each DC-DC power converter 18, 20 and 22 may be controlled by a controller in any suitable arrangement. For example, each DC-DC power converter 18, 20 and 22 may include its own controller, cell monitors each associated with a corresponding one of the battery cell modules 12, 14 and 16 may include controllers for controlling operation of a corresponding one of the DC-DC power converters 18, 20 and 22, etc.

The DC-DC power converters 18, 20 and 22 may operate unidirectionally or bi-directionally. For example, the DC-DC power converters 18, 20 and 22 may include a converter topology that allows power to flow in only one direction (e.g., from the high voltage side to the low voltage side) or both directions. When the DC-DC power converters 18, 20 and 22 operate bi-directionally, power may flow towards the low voltage bus 26. Power may also flow towards the battery cell modules 12, 14 and 16 for recharging or otherwise maintaining a target state of charge of the battery cell modules 12, 14 and 16.

The DC-DC power converters 18, 20 and 22 may operate at any suitable frequency value. For example, the DC-DC power converters 18, 20 and 22 may operate at a switching frequency of about 100 kHz or more. In some embodiments, the switching frequency may be between about 100 kHz and about 1 MHz. For example, the switching frequency may be 100 kHz, 200 kHz, 300 kHz, 400 kHz, 500 kHz, 600 kHz, 700 KHz, 800 KHz, 900 kHz, 1 MHZ, and/or any other value therebetween. In other example embodiments, the switching frequency may be more than 1 MHz.

Figure 2:
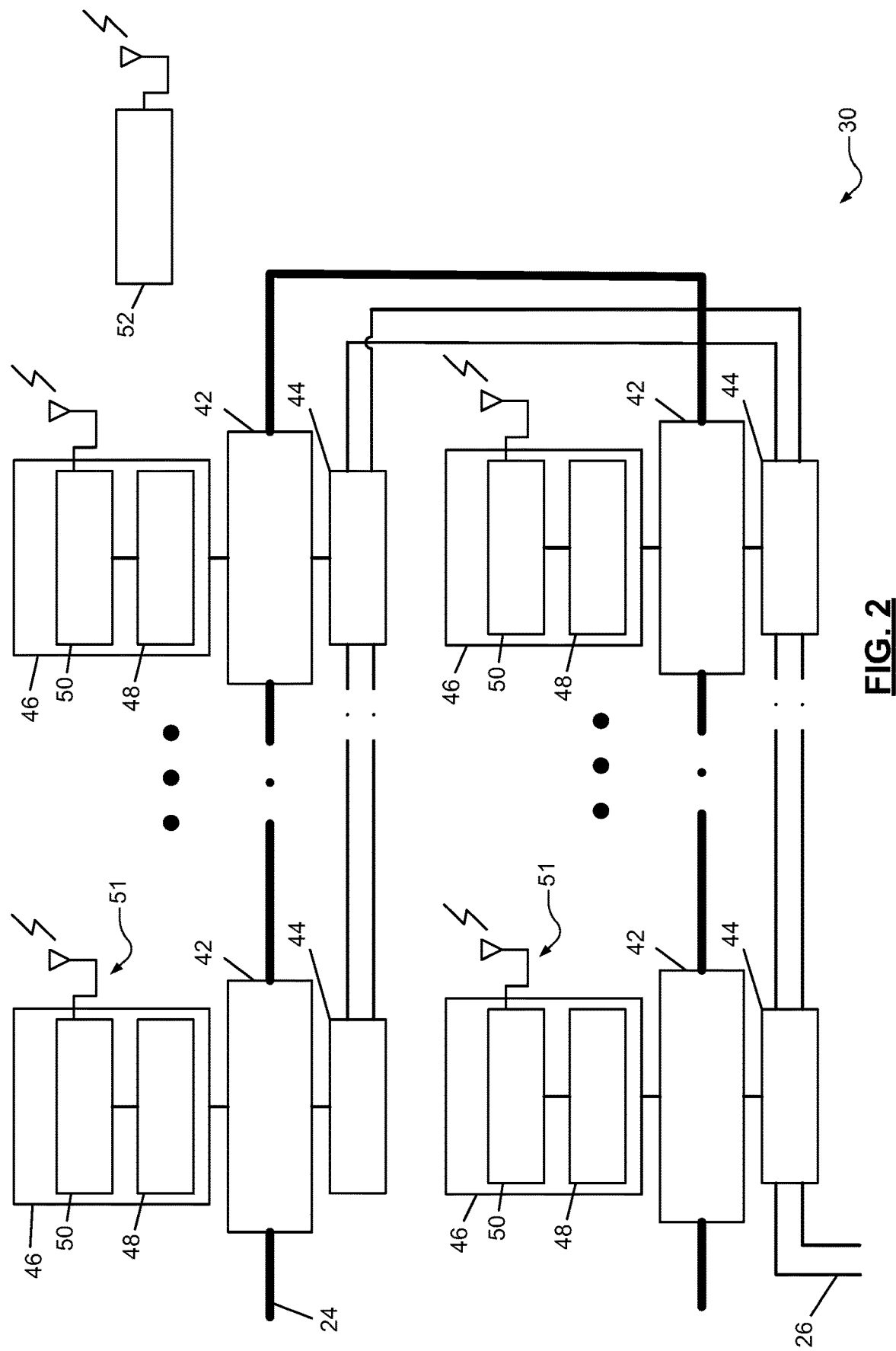
FIG. 2 is a block diagram illustrating an example vehicle battery system including multiple DC-DC converters electrically coupled with a low voltage bus.

FIG. 2 is a block diagram illustrating an example of a vehicle battery system 30 including multiple DC-DC converters 44 electrically coupled with a low voltage bus 26. The vehicle battery system 30 also includes multiple battery cell modules electrically coupled with a high voltage bus 24.

The high voltage bus 24 may be configured to supply high voltage power to a component of the vehicle, such as an electric motor. The high voltage may have any suitable voltage value, such as greater than or equal to 60V, greater than or equal to 300V, greater than or equal to 400V, greater than or equal to 800V, etc. As shown in FIG. 2, the battery cell modules 42 are connected together in series. In other embodiments, the battery cell modules 42 may be connected in parallel, or any other suitable connection arrangement.

A cell monitor 46 (e.g., a cell monitor unit (CMU)) is coupled with (e.g., integrated with) each battery cell module 42. The cell monitor 46 may be configured to monitor operating parameters of the battery cell module 42, such as a voltage of the battery cell module, a temperature of the battery cell module, a current of the battery cell module, a power of the battery cell module, the voltage of any cell within the battery cell module, etc.

The cell monitor 46 includes a controller 48. The controller 48 may be configured to control operation of the cell monitor 46, of the battery cell module 42, of a DC-DC converter 44, etc. For example, the controller 48 may be configured to execute computer-executable instructions that are accessible to the controller 48, stored with the controller 48, etc.

The cell monitor 46 also includes a transmitter 50, and an antenna 51. The cell monitor 46 may be configured to wirelessly transmit operating parameters of the battery cell module 42 to a central controller, for monitoring of multiple battery cell modules 42 at the central controller, balancing voltages of the battery cell modules 42, controlling charging and discharging of the battery cell modules 42, etc.

As shown in FIG. 2, the DC-DC converters 44 may be connected in series with the low voltage bus 26. In other embodiments, the DC-DC converters 44 may be connected in parallel with the low voltage bus 26 (or any other suitable connection arrangement).

The low voltage bus 26 may be configured to supply power to vehicle electric components that operate on lower voltages. For example, the low voltage bus 26 may supply power at a voltage of less than or equal to about 3.3V, less than or equal to about 5V, less than or equal to about 12V, less than or equal to about 24V, less than or equal to about 48V, etc.

There may or may not be a one-to-one correspondence between the battery cell modules 42 and the DC-DC converters 44. For example, a DC-DC converter 44 may receive inputs from more than one battery cell module 42, multiple DC-DC converters 44 may be supplied by a single battery cell module, a DC-DC converter 44 may receive inputs from at least one cell within the battery cell module 42, etc.

In some example embodiments, there may be communication buses, etc., between the DC-DC converters 44. The communication bus(es) may allow the DC-DC converters 44 to perform dynamic power sharing, to maintain an equal or substantially equal power flow within each DC-DC converter.

Figure 3:
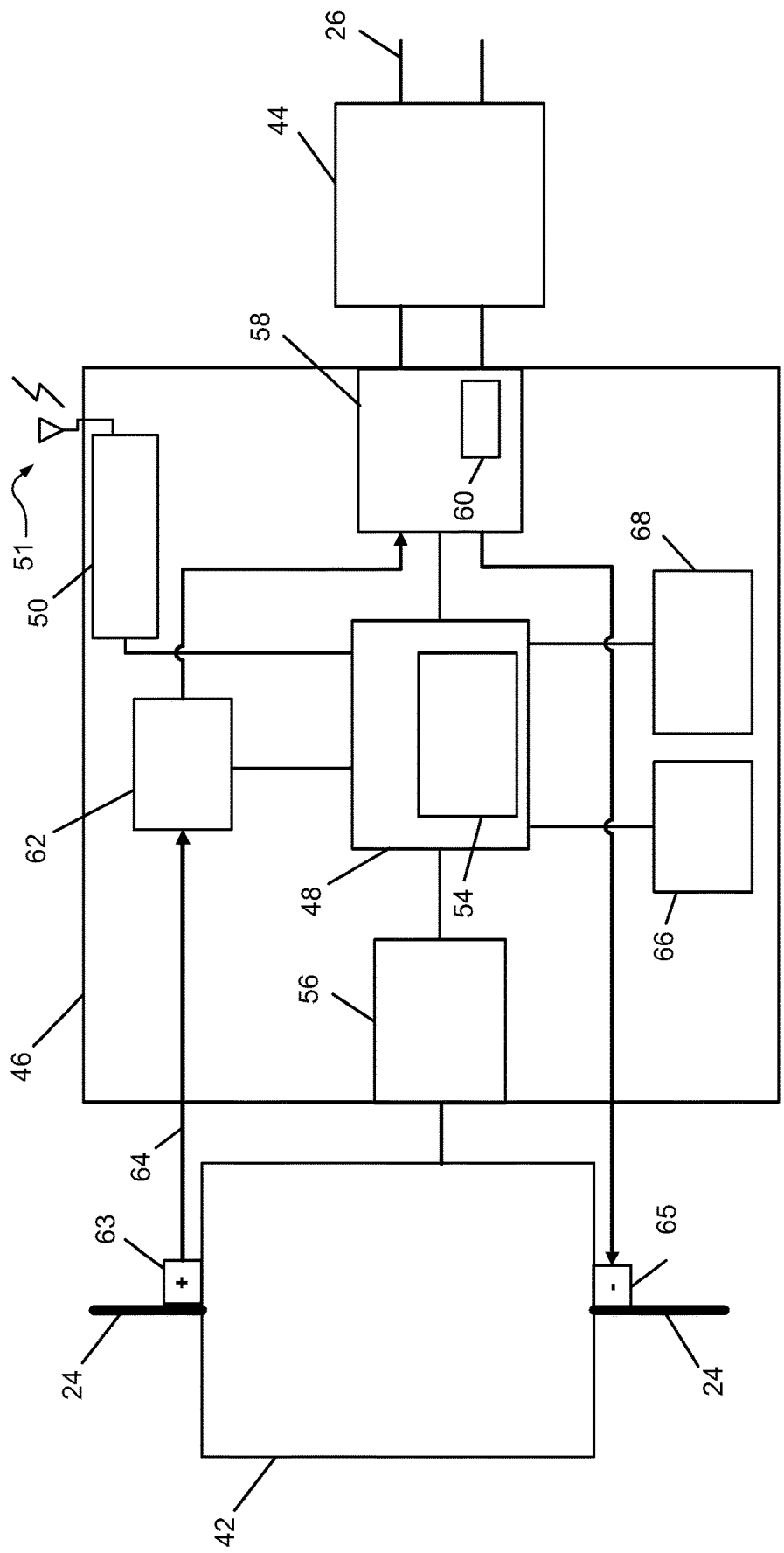
FIG. 3 is a block diagram illustrating an example battery cell monitor including a current sensor for sensing a current from the battery cell to a DC-DC converter.

FIG. 3 is a block diagram illustrating an example of a cell monitor 46 including a current sensor 62 for sensing a current from the battery cell module 42 to a DC-DC converter 44.

As shown in FIG. 3, the battery cell module 42 is coupled with the high voltage bus 24. The cell monitor 46 is illustrated as coupled between the battery cell module 42 and the DC-DC converter 44. In other embodiments, the DC-DC converter 44 may be directly coupled to the battery cell module 42, etc.

The cell monitor includes a battery cell temperature and voltage sensor 56. The battery cell temperature and voltage sensor 56 is configured to obtain voltage and temperature operating parameters of the battery cell module 42 on a periodic basis. In various implementations, there may be a voltage sensor for each battery cell within a battery module, such that the cell monitor may include more than one voltage sensor.

For example, the battery cell temperature and voltage sensor 56 may include its own voltage and temperature sensors for obtaining operating parameters of the battery cell module 42, may include terminals, wires, electrical connections, etc. to the battery cell module 42 for obtaining operating parameters from the battery cell module 42, etc.

The cell monitor 46 may be configured to receive power from the battery cell module 42, in order to supply power to the DC-DC converter 44. For example, the cell monitor 46 includes a DC-DC converter interface 58 for, e.g., supplying power to the DC-DC converter 44, sensing operating parameters of the DC-DC converter 4, controlling switching operation of the DC-DC converter 44, etc. The DC-DC converter 44 is configured to provide low voltage power to the low voltage bus 26.

In particular, an electrical connection 64 is coupled between a positive terminal 63 of the battery cell module 42, and a negative terminal 65 of the battery cell module 42, to provide power to the DC-DC converter 44 via the cell monitor 46. The cell monitor 46 includes a current sensor 62 configured to measure a current flowing through the electrical connection 64, which may represent an input current to the DC-DC converter 44 (e.g., via the DC-DC converter interface 58).

The current sensor 62 is coupled with a controller 48 of the cell monitor 46. The controller 48 includes a battery SOC estimation module 54. For example, the controller 48 may execute computer-executable instruction of the battery SOC estimation module 54 to estimate a state of charge of the battery cell module 42, based on, e.g., an input current to the DC-DC converter 44 as measured by the current sensor 62, and voltage and temperature operating parameters of the battery cell module 42 as measured by the battery cell temperature and voltage sensor 56.

The controller may be controller 48 may be configured to control operation of the cell monitor 46, of the DC-DC converter 44, of the battery cell module 42, etc., based on an estimation of the state of charge of the battery cell module from the battery SOC estimation module 54.

The current sensor 62 may include any suitable current sensing device, including but not limited to a copper conductor resistance type current sensor, a hall effect current sensor, a giant magneto resistive (GMR) current sensor, a tunneling magneto resistive (TMR) current sensor, a current shunt, a coreless current sensor, a point-field detector, any other suitable current sensor device that may sense current that can be read by a controller, etc.

The cell monitor 46 also includes a bias power source module 66 configured to provide bias power to the controller 48, and a signal conditioning module 68. The signal conditioning module 68 may be configured to perform signal processing on signals received by the cell monitor 46, transmitted by the cell monitor 46, processed by the cell monitor 46, etc., which may include PWM signal conditioning.

As mentioned above, the cell monitor 46 includes a transmitter 50 coupled with an antenna 51. The controller 48 may be configured to transmit operation parameters of the battery cell module 42 to a central controller, via the transmitter 50 and the antenna 51.

Integrating the current sensor 62 with the cell monitor 46, to measure an input current supplied by the battery cell module 42 to the DC-DC converter 44, may allow for estimation of a state of charge, state of health, state of function, etc., of an individual battery cell module. This information may be used to improve the voltage balancing of multiple battery cell modules, to improve charging and discharging of individual battery cell modules, to better utilize capacity of individual battery cell modules, etc.

As shown in FIG. 3, the cell monitor 46 may include a fuse 60, such as in the DC-DC converter interface 58. The fuse 60 may provide protection to the cell monitor 46 and/or the DC-DC converter 44, e.g., by inhibiting or preventing overcurrent conditions, etc. The fuse 60 may be a passive fuse, a programmable/resettable electronic fuse, etc. In some examples, a fusible link current sensor may be used as a combined sensor and fuse (which may be non-serviceable).

Figure 4:
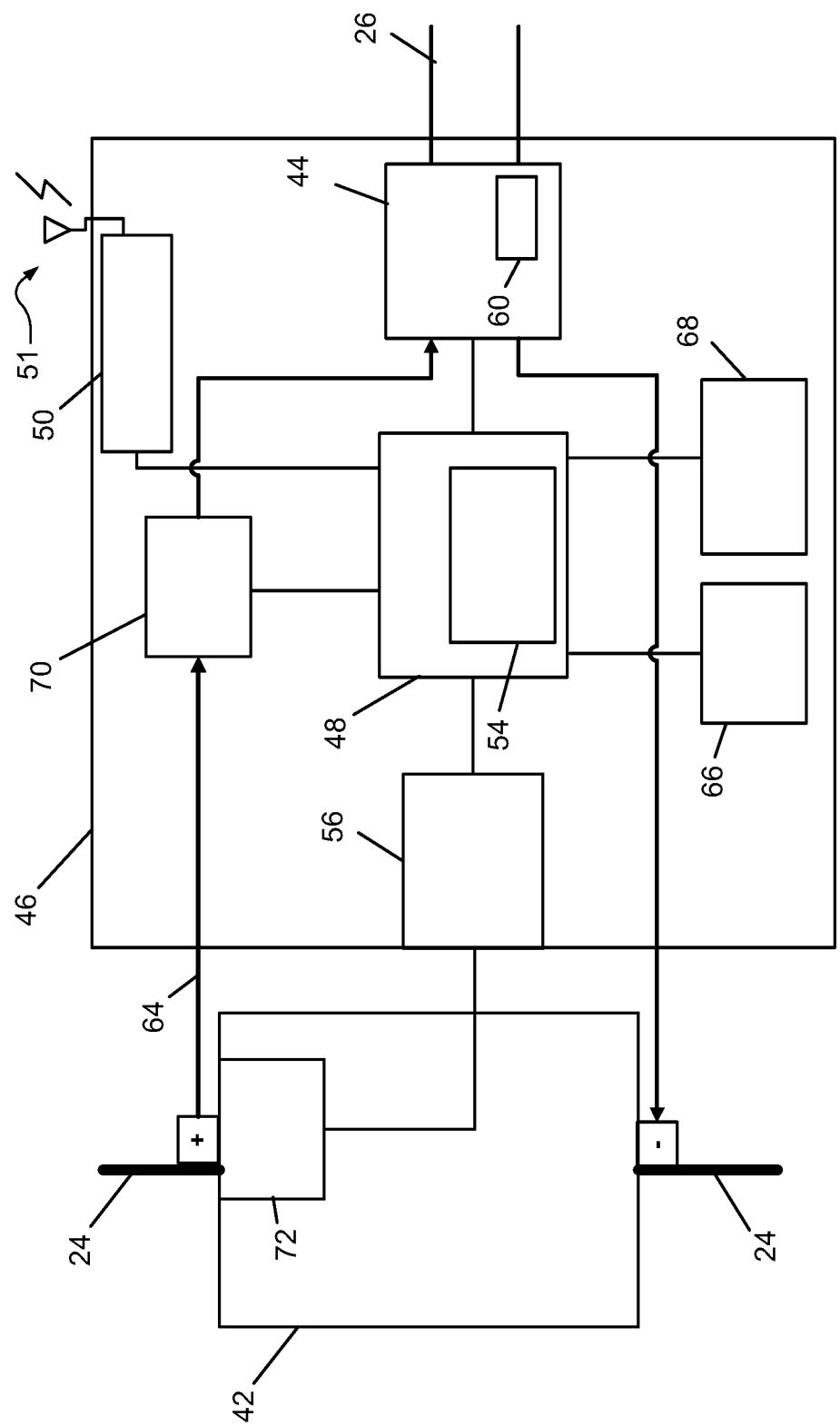
FIG. 4 is a block diagram illustrating another example battery cell monitor, including a DC-DC converter integrated with the battery cell monitor.

FIG. 4 is a block diagram illustrating another example of a cell monitor 46, including a DC-DC converter 44 integrated with the cell monitor 46. The DC-DC converter 44 may be housed with the cell monitor 46 (e.g., in a same enclosure, etc.), and may output low voltage power to the low voltage bus 26 via, e.g., output terminals of the cell monitor 46. In various implementations, the DC-DC converter 44 may be on a same circuit board as the cell monitor 46, in a same package as the cell monitor 46, etc.

As shown in FIG. 4, the cell monitor includes a converter current sensor 70 configured to detect a current flowing from the battery cell module 42 to the DC-DC converter 44. The converter current sensor 70 may be similar to the current sensor 62 of FIG. 4.

The controller 48 also receives input from a cell current sensor 72. The cell current sensor 72 is configured to measure a current though the battery cell module 42 (e.g., along the high voltage bus 24), which may be referred to as a high voltage bus current.

The controller 48 may be configured to determine a net current (e.g., a total current), based on the current measured by the converter current sensor 70 and the current measured by the cell current sensor 72. For example, the controller 48 may add a sum of the measured high voltage bus current and the measured DC-DC converter input current.

The controller 48 may be configured to estimate a state of charge of the battery cell module 42 based on both the current measured by the cell current sensor 72 and the current measured by the converter current sensor 70. For example, measuring the high voltage bus current at the battery cell module and the current at the input to the DC-DC converter 44, may provide a more accurate measure of the net current in the battery cell module 42, for a better estimation of the state of charge of the individual battery module.

The values of the current measured by the cell current sensor 72 and the current measured by the converter current sensor 70 may be provided to a central system controller, such as via the transmitter 50 and the antenna 51. Providing current measurements from both locations may improve the voltage balancing of multiple battery cell modules, improve charging and discharging of individual battery cell modules, better utilize capacity of individual battery cell modules, etc.

Figure 5:
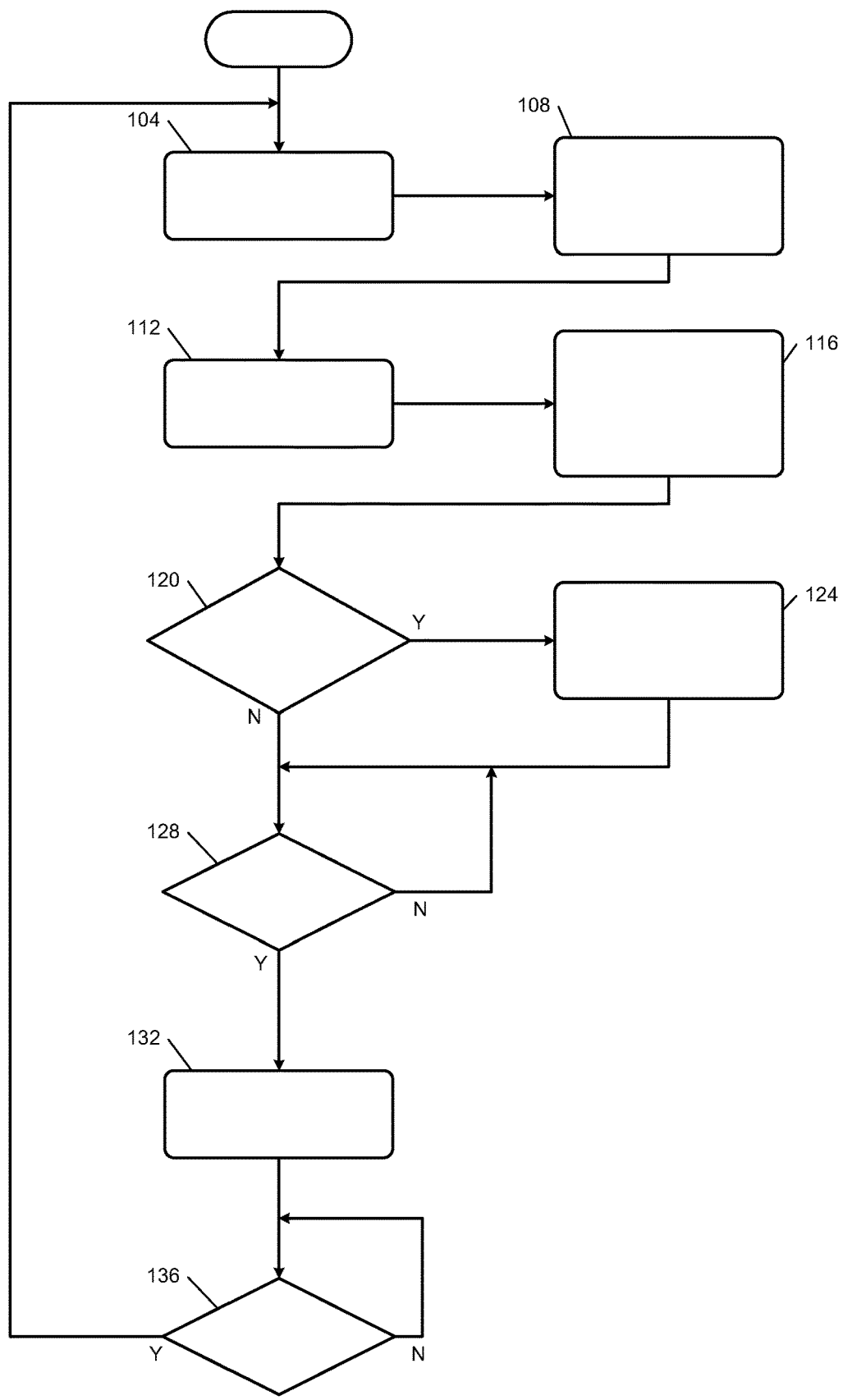
FIG. 5 is a flow chart depicting an example process for estimating a state of charge of a battery cell module according to a sensed current from the battery cell module to a DC-DC converter.

FIG. 5 is a flow chart depicting an example process for estimating a state of charge of a battery cell module according to a sensed current from the battery cell module to a DC-DC converter. The process may be performed by, e.g., the controller 48 of FIG. 4. For example, the controller 48 may execute the battery SOC estimation module 54 to implement steps of the process illustrated in FIG. 5.

At 104, the controller is configured to sense battery cell voltage and temperature parameters of the battery cell. The controller then senses DC-DC converter current at 108, such as via the converter current sensor 70 illustrated in FIG. 5.

The controller is configured to sense a battery cell bus current (e.g., high voltage bus current) at 112. For example, the cell current sensor 72 of FIG. 4 may provide a measured battery cell bus current to the controller 48. The controller is then configured to determine a total battery cell current at 116, based on converter current and the bus current.

For example, a net current may be determined that accounts for both the measured current though the battery module along the high voltage bus, and the amount of current that is directed from the battery module to the input of the DC-DC converter.

At 120, the controller is configured to determine whether a battery cell or DC-DC converter operation parameter is outside of a specified range. For example, the controller may determine whether the voltage of the battery cell is within a specified range, whether a current to the DC-DC converter is experiencing an overcurrent condition, etc.

If the controller determines at 120 that a battery cell or DC-DC converter parameter is outside of the normal or specified operating range, the controller is configured to adjust an operation setting of the DC-DC converter or the battery cell at 124. For example, the controller may adjust switching operation of the DC-DC converter, change a set point of the battery cell or the DC-DC converter, inhibit current conduction from the battery cell to the DC-DC converter, etc.

If the controller determines at 120 that battery cell and DC-DC converter parameters are within the specified operating range (or after adjusting an operation setting of the battery cell or the DC-DC converter at 124), the controller is configured to determine at 128 whether a transmit period has elapsed.

For example, a controller may be configured to transmit measured operating parameters of the battery cell and/or the DC-DC converter to a central system controller, on a periodic basis. The parameters may be transmitted every tenth of a second, every hundredth of a second, etc.

After the transmit period elapses at 128, the controller is configured to transmit the sense parameters to the central system controller, at 132. The controller then determines whether a sense period has elapsed at 136. For example, the controller may be configured to measure operating parameters of the battery cell and/or the DC-DC converter ten times per second, one hundred times per second, etc. After the sense period has elapsed, the controller is configured to return to 104 to sense the battery cell voltage and temperature again.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery system for an electric vehicle, the battery system comprising:
multiple battery cells each configured to store charge for powering an electric vehicle;
a high voltage bus electrically coupled with the multiple battery cells to provide power to an electric motor of the electric vehicle, the multiple battery cells coupled in series with the high voltage bus;
multiple DC-DC converters each electrically coupled with a corresponding one of the multiple battery cells;

a low voltage bus electrically connected between the multiple DC-DC converters and at least one vehicle electrical component, the low voltage bus configured to provide low voltage power to the at least one vehicle electrical component; and multiple cell monitors each electrically coupled with a corresponding one of the multiple battery cells and a corresponding one of the multiple DC-DC converters, wherein each cell monitor includes a first current sensor configured to detect a first current from the corresponding one of the multiple battery cells to the corresponding one of the multiple DC-DC converters, each cell monitor includes a second current sensor configured to detect a second current through the corresponding one of the multiple battery cells along the high voltage bus, and each cell monitor includes a controller configured to:

estimate a state of charge of the corresponding one of the multiple battery cells according to the first current detected by the first current sensor and the second current detected by the second current sensor; and adjust switching operation of the corresponding one of the multiple DC-DC converters according to the first current detected by the first current sensor and the second current detected by the second current sensor.

2. The battery system of claim 1, wherein each of the multiple DC-DC converters is electrically coupled between the low voltage bus and a corresponding one of the multiple battery cells.

3. The battery system of claim 1, wherein:
each cell monitor includes a battery cell interface configured to obtain a sensed voltage of the corresponding one of the multiple battery cells and a sensed temperature of the corresponding one of the multiple battery cells; and each controller is configured to estimate the state of charge of the corresponding one of the multiple battery cells according to the sensed voltage of the corresponding one of the multiple battery cells and the sensed temperature of the corresponding one of the multiple battery cells.

4. The battery system of claim 1, wherein each DC-DC converter is integrated on a same circuit board with the corresponding one of the multiple cell monitors.

5. The battery system of claim 1, wherein each controller is configured to transmit the estimated state of charge of the corresponding one of the multiple battery cells to a central system controller.

6. The battery system of claim 5, wherein:
each cell monitor includes a transmitter electrically coupled with an antenna; and each controller is configured to transmit the estimated state of charge to the central system controller wirelessly via the transmitter and the antenna.

7. The battery system of claim 5, wherein:
multiple wires are each electrically connected between a corresponding one of the multiple cell monitors and the central system controller; and each controller is configured to transmit the estimated state of charge to the central system controller via a corresponding one of the multiple wires.

8. The battery system of claim 1, wherein each DC-DC converter is configured to output power to the low voltage bus at a voltage of less than or equal to 48 volts.

9. The battery system of claim 1, wherein each second current sensor is coupled in series with the corresponding one of the multiple battery cells.

10. The battery system of claim 9, wherein each controller is configured to:
determine a total current according to a combination of the second current through the corresponding one of the multiple battery cells along the high voltage bus as detected by the second current sensor, and the first current detected from the corresponding one of the multiple battery cells to the corresponding one of the multiple DC-DC converters; and estimate the state of charge of the corresponding one of the multiple battery cells according to the total current.

11. The battery system of claim 9, wherein:
each first current sensor is configured to detect the first current from the corresponding one of the multiple battery cells to the corresponding one of the multiple DC-DC converters has a current rating in a range from about 10 amps to about 30 amps; and each second current sensor has a current rating in a range from about 100 amps to about 1000 amps.

12. The battery system of claim 10, wherein each controller is configured to estimate an input current of the corresponding one of the multiple DC-DC converters according to a combination of the total current, a temperature of the corresponding one of the multiple battery cells, a trim voltage setting, and at least one of an input voltage of the corresponding one of the multiple DC-DC converters or an output voltage of the corresponding one of the multiple DC-DC converters.

13. The battery system of claim 1, wherein each first current sensor includes at least one of a hall effect current sensor, a giant magneto resistive (GMR) current sensor, and a tunneling magneto resistive (TMR) current sensor.

14. The battery system of claim 1, wherein each first current sensor comprises a fusible link current sensor electrically coupled with the corresponding one of the multiple DC-DC converters.

15. The battery system of claim 1, wherein each cell monitor includes a fuse coupled with the corresponding one of the multiple DC-DC converters.

16. The battery system of claim 15, wherein the fuse comprises a programmable and resettable electronic fuse.

17. A battery system for an electric vehicle, the battery system comprising:
multiple battery cells each configured to store charge for powering an electric vehicle;

a high voltage bus electrically coupled with the multiple battery cells to provide power to an electric motor of the electric vehicle, the multiple battery cells coupled in series with the high voltage bus;

multiple DC-DC converters each electrically coupled with a corresponding one of the multiple battery cells;

a low voltage bus electrically connected between the multiple DC-DC converters and at least one vehicle electrical component, the low voltage bus configured to provide low voltage power to the at least one vehicle electrical component; and multiple cell monitors each electrically coupled with a corresponding one of the multiple battery cells and a corresponding one of the multiple DC-DC converters, wherein each cell monitor includes a first current sensor configured to detect a first current from the corresponding one of the multiple battery cells to the corresponding one of the multiple DC-DC converters, a second current sensor configured to detect a second current through the corresponding one of the multiple battery cells along the high voltage bus, a transmitter, an antenna, and a controller configured to:
- estimate a state of charge of the corresponding one of the multiple battery cells according to the first current detected by the first current sensor and the second current detected by the second current sensor; and
- transmit the estimated state of charge to a central system controller wirelessly via the transmitter and the antenna.

18. The battery system of claim 17, wherein:
each of the multiple DC-DC converters electrically is coupled between the low voltage bus and a corresponding one of the multiple battery cells.

19. A battery system for an electric vehicle, the battery system comprising:
- multiple battery cells each configured to store charge for powering an electric vehicle;
- a high voltage bus electrically coupled with the multiple battery cells to provide power to an electric motor of the electric vehicle, the multiple battery cells coupled in series with the high voltage bus;
- multiple DC-DC converters each electrically coupled with a corresponding one of the multiple battery cells;
- a low voltage bus electrically connected between the multiple DC-DC converters and at least one vehicle electrical component, the low voltage bus configured to provide low voltage power to the at least one vehicle electrical component;
- multiple battery current sensors each coupled in series with a corresponding one of the multiple battery cells, wherein each battery current sensor is configured to detect a current through the corresponding one of the multiple battery cells along the high voltage bus; and
- multiple cell monitors each electrically coupled with a corresponding one of the multiple battery cells and a corresponding one of the multiple DC-DC converters, wherein each cell monitor includes a converter current sensor configured to detect a current from the corresponding one of the multiple battery cells to the DC-DC converter, wherein each cell monitor includes a controller configured to:
  - determine a total current according to a combination of the current through the corresponding one of the multiple battery cells along the high voltage bus as detected by the corresponding one of the multiple battery current sensors, and the current detected from the corresponding one of the multiple battery cells to the corresponding one of the multiple DC-DC converters;
  - estimate a state of charge of the corresponding one of the multiple battery cells according to the total current; and
  - adjust switching operation of the corresponding one of the multiple DC-DC converters according to the total current.

20. The battery system of claim 19, wherein each controller is configured to transmit the estimated state of charge of the corresponding one of the multiple battery cells to a central system controller.

* * * * *